(12) United States Patent
Kehrer et al.

(10) Patent No.: US 7,956,665 B2
(45) Date of Patent: Jun. 7, 2011

(54) METHODS AND ARTICLES OF MANUFACTURE FOR OPERATING ELECTRONIC DEVICES ON A PLURALITY OF CLOCK SIGNALS

(75) Inventors: Daniel Kehrer, Munich (DE); Hermann Ruckerbauer, Moos (DE); Martin Streibl, Petershausen (DE)

(73) Assignee: Qimonda AG, Munich (DE)

( * ) Notice: Subject to any disclaimer, the term of this patent is extended or adjusted under 35 U.S.C. 154(b) by 30 days.

(21) Appl. No.: 12/040,473

(22) Filed: Feb. 29, 2008

(65) Prior Publication Data

US 2009/0219063 A1 Sep. 3, 2009

(51) Int. Cl.
 *H03K 3/00* (2006.01)
(52) U.S. Cl. ......... 327/295; 327/47; 327/48; 327/141; 327/231; 327/117; 333/81 R; 333/127
(58) Field of Classification Search .......... 327/296, 327/297, 141, 144, 145, 231, 107, 232, 235, 327/117, 291, 299, 115, 47, 48; 333/81 R, 333/127
See application file for complete search history.

(56) References Cited

U.S. PATENT DOCUMENTS

| | | | |
|---|---|---|---|
| 5,331,297 A * | 7/1994 | Kubo et al. ............ | 333/127 |
| 6,181,174 B1 * | 1/2001 | Fujieda et al. ............ | 327/158 |
| 6,823,029 B1 * | 11/2004 | Chapman et al. ............ | 375/354 |
| 7,215,163 B2 * | 5/2007 | Scheideler et al. ......... | 327/115 |
| 2002/0036531 A1 * | 3/2002 | Hirairi .................... | 327/218 |
| 2005/0104670 A1 * | 5/2005 | Naviasky et al. ........... | 331/16 |
| 2007/0025489 A1 * | 2/2007 | Milton et al. .............. | 375/375 |
| 2009/0091361 A1 * | 4/2009 | Korpi et al. .............. | 327/117 |

FOREIGN PATENT DOCUMENTS

WO 2004 077514 9/2004

OTHER PUBLICATIONS

Hans-Dieter Wohlmuth and Daniel Kehrer, A High Sensitivity Static 2:1 Frequency Divider up to 27GHz in 120nm CMOS, Proceedings of the 28th European Solid-State Circuits Conference, 2002 (ESSCIRC 2002), Sep. 24-26, 2002, pp. 823-827.

* cited by examiner

*Primary Examiner* — Lincoln Donovan
*Assistant Examiner* — Shikha Goyal
(74) *Attorney, Agent, or Firm* — Patterson & Sheridan, LLP

(57) ABSTRACT

Embodiments of the invention relate to an integrated circuit comprising at least one functional unit configured to operate at a first clock frequency. The integrated circuit also comprises at least one first interconnect originating from a contact pad and leading to at least one frequency divider configured to receive a clock signal having a second frequency and generate one or more clock signals to operate the functional unit at the first frequency. The integrated circuit further comprises at least one second interconnect coupling an output of the frequency divider and an input of the functional unit, wherein a total length of the second wired interconnect is less than a total length of the first wired interconnects.

13 Claims, 6 Drawing Sheets

US 7,956,665 B2

METHODS AND ARTICLES OF MANUFACTURE FOR OPERATING ELECTRONIC DEVICES ON A PLURALITY OF CLOCK SIGNALS

BACKGROUND OF THE INVENTION

Modern electronic devices may contain one or more synchronous functional units such as, for example, memory, microprocessors, controllers, or any other digital circuitry such as flip-flops, shift registers, and the like. The functional units may be configured to perform operations on a signal edge of a clock. For example, the functional units may perform operations such as transferring or receiving data, computing an arithmetic result, asserting a signal, and the like, upon detecting a signal edge of a clock signal.

To operate a functional unit a clock signal may be generated by a clock signal generator, for example, an oscillator circuit comprising an inductor and a capacitor, a quartz oscillator, or the like. The clock signal may be supplied to that functional unit. If a plurality of functional units are synchronized, each of the functional units is coupled to the clock signal generator to receive the clock signal. The functional units may be sensitive to a certain pattern of the clock signal, e.g. a leading edge, a trailing edge, a voltage level or the like.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
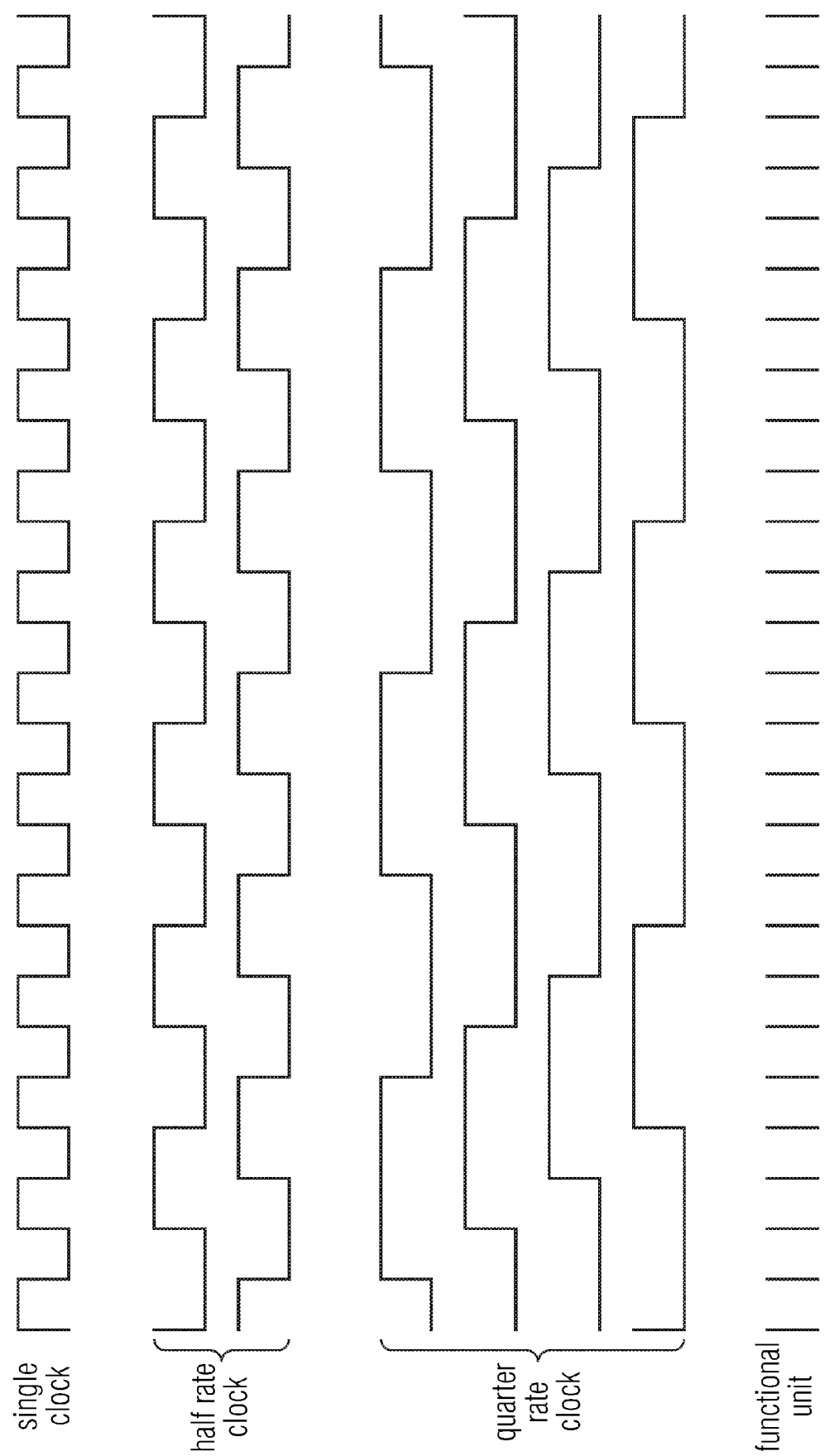
FIG. 1 illustrates an exemplary timing diagram of clock signals according to an embodiment of the invention.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal names used below are exemplary names, indicative of signals used to perform various functions in a given memory device. In some cases, the relative signals may vary from device to device. Furthermore, the circuits and devices described below and depicted in the figures are merely exemplary of embodiments of the invention. As recognized by those of ordinary skill in the art, embodiments of the invention may be utilized with any memory device.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

FIG. 1 illustrates an exemplary timing diagram of clock signals according to an embodiment of the invention. In the last line of FIG. 1, an exemplary working cycle of an exemplary functional unit out of a plurality of functional units, such as, for example, the functional units of FIG. 4a, 4b, 4c or 4d is shown. Each vertical line shown in the last line of FIG. 1 may mark a point in time when the functional unit operates or should operate. The particular task or operation performed during each point in time marked by a vertical line may depend on a type of functional unit being used. For example, in one embodiment, a DRAM memory may deliver data at a point in time marked by a vertical line in last line of FIG. 1. In another embodiment, a microprocessor may perform a step of a calculation at a point in time marked by a vertical line.

While a memory device and a microprocessor are described herein as exemplary functional units, embodiments of the invention are not limited to memory devices and microprocessors. Rather, other functional units, such as, for example, counters, flip flops, and the like, that operate in conjunction with a clock signal fall within the scope of the invention. Furthermore, any reasonable type of operation may be performed at each point in time marked by the vertical lines based on the particular type of functional unit that is implemented.

In one embodiment, each point in time marked in the last line of FIG. 1 may correspond to a transition of a single clock signal. For example, each vertical line in FIG. 1 corresponds to a rising edge of the single clock cycle as shown in the first line of FIG. 1. In some embodiments, the functional unit may be triggered to operate at any leading and/or trailing edge of the single clock signal.

In some embodiments, the single clock signal may have a relatively high clock frequency. At high clock frequencies the single clock signal may become attenuated by the time it is delivered over a wide span network to one or more functional units on, for example, an integrated circuit. In one embodiment of the invention, the single clock signal may be split into two clock signals, each of the two clock signals having half the frequency of the clock signal and having a phase angle of 90° between each other. The functional unit may be configured to operate on any leading or trailing edge of any of said two half rate clock signals. Therefore, the operating frequency of the functional unit does not change although the frequency of the clock signal is halved.

In one embodiment, splitting the single clock signal into two half rate clock signals may be performed by means of a device such as, for example, a monolithic part of an integrated circuit comprising at least one functional unit. In another embodiment, the single clock signal may be delivered to the package of an integrated circuit and the half rate clock signal may be generated by a separate device located in the same package as the integrated circuit comprising the at least one functional unit. In still another embodiment, a half rate clock signal may be generated by a clock generator located on the same printed circuit board as the circuit comprising the at least one functional unit.

According to one embodiment of the invention, the half rate clock signal may be delivered by a first interconnecting network 6 to frequency dividers 3 located in the vicinity of the functional units 4. By means of frequency divider 3, any of said half rate clock signals may be further split up into clock signals having half the frequency of the half rate clock signal and a phase relation of 90°, leading to a set of four quarter rate clock signals as shown in line 4 to 7 of FIG. 1. Any of said quarter rate clock signal may have a frequency corresponding to a quarter of the frequency of the single clock signal shown in line 1. In one embodiment, each of said quarter rate clock signals may have a phase shift of 45° with respect to at least one other clock signal. The functional unit may operate on any leading or trailing edge of any of said quarter rate clock signals, thereby maintaining its original working speed. For delivering said quarter rate clock signal to said functional unit, a set of four interconnects is used in this embodiment.

In one embodiment, to improve the signal-to-noise ratio and thereby the timing accuracy of said functional unit, inverted clock signals may be delivered to each functional unit in addition to the clock signals shown in FIG. 1, thereby forming differential clock signals. This may double the number of interconnecting lines. Therefore, in the case of a quarter rate clock system eight interconnecting lines may be used.

Figure 2:
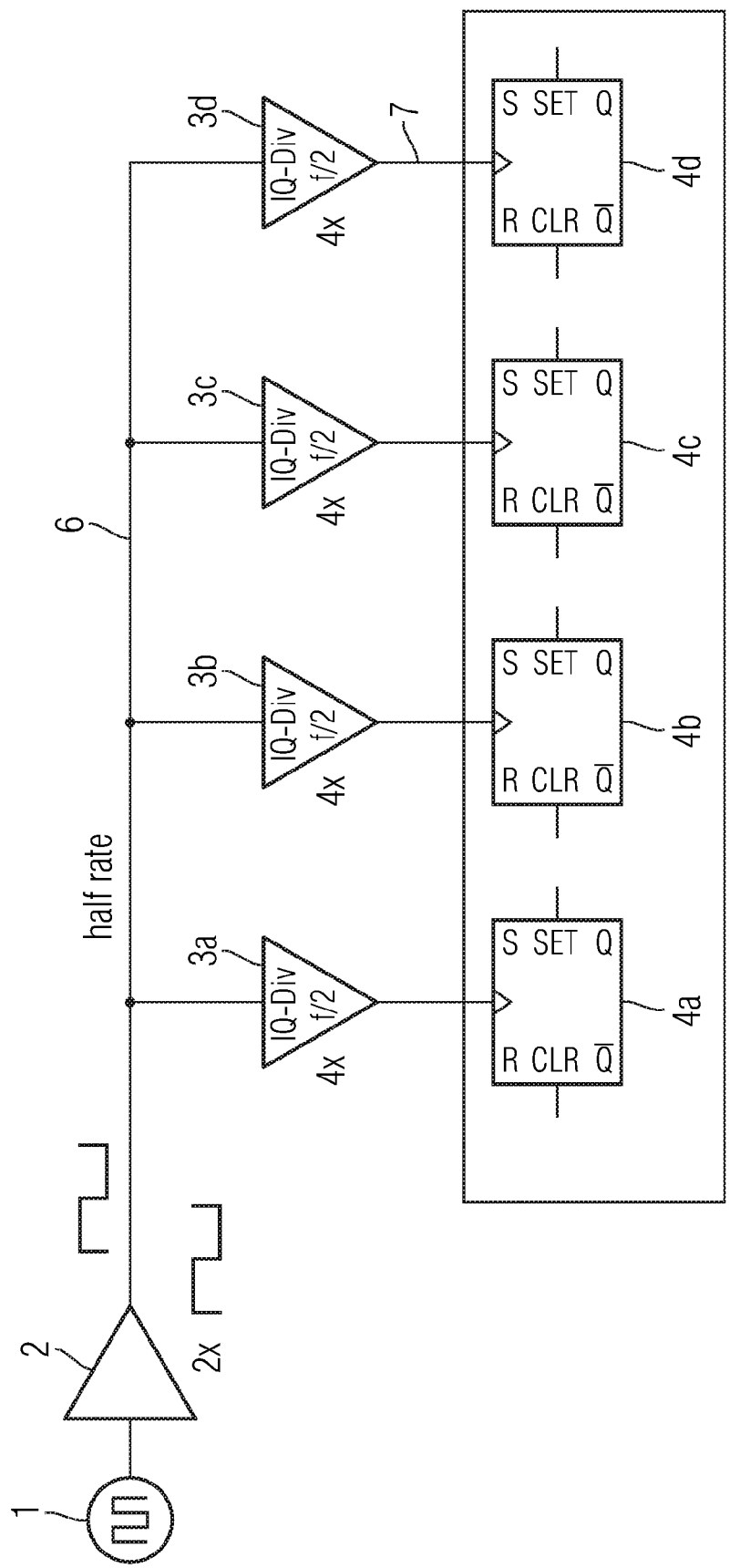
FIG. 2 illustrates an exemplary clock distribution network according to an embodiment of the invention.

FIG. 2 illustrates a clock generator 1, according to an embodiment of the invention. The clock generator may include an inductor, a capacitor, and/or a quartz oscillator, or the like. In one embodiment the clock generator 1 may be included together with the integrated circuit on the same semiconductor die. In another embodiment, the clock generator may be integrated together with the integrated circuit in the same package and a bond wire may be used as an interconnect to connect the clock generator to the integrated circuit. In yet another embodiment, the clock generator 1 may be a separate device which may be coupled to the integrated circuit by use of a cable, a printed circuit board or an optical interconnect. If the clock generator 1 is not integrated on the same semiconductor die, then said integrated circuit may comprise a bond pad (not shown in FIG. 2) which may be coupled with an output of the clock generator.

In one embodiment, the clock generator may be adapted to produce a single clock signal at a predetermined clock rate, such as, for example, the single clock signal illustrated in FIG. 1. In another embodiment, the clock generator may be configured to produce two or more output signals having a predetermined frequency and being correlated to each other with a constant phase. A constant phase as it is defined here may involve some jitter of one or both clock signals, so that slight variations of the phase occur. In one implementation the phase may be 90°.

In one embodiment, the clock signal may be supplied to an amplifier 2 that is formed on the semiconductor die of the integrated circuit. The amplifier 2 may be adapted to give the clock signal predetermined amplitude. In another embodiment, the amplifier 2 may be configured to filter the clock signal in order to remove noise from the clock line. In yet another embodiment, the amplifier 2 may be configured to generate a plurality of clock signals at its output from a single input signal. For example, in one embodiment the amplifier circuit 2 may generate a two clock signals at its output in response to receiving an input signal. In further embodiments, the amplifier 2 may be configured to change the frequency of a clock signal generated by clock signal generator 1. In some embodiments, the amplifier 2 may be omitted.

The clock signal may be distributed by use of first wired interconnects 6. In one embodiment, the interconnect may be made from a metallization layer. In one embodiment, the metallization layer may be made by electroplating or vacuum deposition techniques. Exemplary metals that may be used to form the metallization layer include aluminum, gold, silver, copper, silver, titanium or the like. It may be made from an alloy. In one embodiment, the metallization layer may include a plurality of sublayers. For example, a first sublayer may be made from titanium and a second sublayer may be made from gold.

In one embodiment, the metallization layer may include a structure of a network originating from at least one contact pad or the output of an amplifier 2 and spanning to one or more frequency dividers 3 located on the semiconductor die of the integrated circuit. If amplifier 2 or clock generator 1 are intended to provide a plurality of clock signals, e.g. two clock signals, then the wired interconnect 6 may comprise also a plurality of signal lines corresponding to the number of clock signals. For example, in a particular embodiment illustrated in FIG. 2, the wired interconnect 6 may include a plurality of clock signal lines to provide two half rate clock signals to each of the frequency dividers 3.

Additionally, in some embodiments, the interconnect 6 may include further structured metallization layers to provide a ground potential or shielding of the signal lines. The geometry of the interconnect 6 may be chosen in a way that a predetermined impedance of the signal lines is achieved. In one embodiment of the invention, each clock signal may have a corresponding inverted signal. The inverted signal may give redundancy and increased signal-to-noise-ratio. Such a pair of signals is referred to as a differential signal.

FIG. 2 illustrates four functional units 4a, 4b, 4c and 4d, according to an embodiment of the invention. While four functional units are shown in FIG. 2, in alternative embodiments, any number of functional units may be included. In one embodiment, the functional units may include memory cells, microcontrollers, microprocessors or any other digital electronics. In one embodiment, the functional units 4a, 4b, 4c and 4d may operate on quarter rate clock signals. The quarter rate clock signals may include four clock signals generated from one single master clock signal. The quarter rate clock signals may have a frequency which is a factor 4 lower than the frequency of the master clock signal. The four clock signals may be correlated to each other with a constant phase. In one embodiment, the phase between at least one pair of the quarter rate clock signals may be 45°. In one embodiment, the functional units 4 may operate at every leading and falling edge from any of the four clock signals. Therefore, the operating frequency of the functional units 4 may be eight times the frequency of a quarter rate clock signal.

In one embodiment, the four quarter rate clock signals may be delivered to the functional units 4a, 4b, 4c and 4d by means of a second wired interconnect 7. The interconnect 7 may include at least four conductive lines each transporting one of the quarter rate clock signals. An inverted signal of each quarter rate clock signal may be optionally provided to give redundancy. In addition, ground lines or shielding may be provided by further interconnecting lines.

In one embodiment of the invention, said second wired interconnect 7 may be shorter than the first wired interconnect 6. This may be achieved by means of four frequency dividers 3a, 3b, 3c and 3d. Each frequency divider 3 may be located in the vicinity of a functional unit 4. By this measure, the second interconnect 7 may be designed shorter than the first interconnect 6. Because the second interconnect 7 may be shorter, the signal degradation between frequency divider 3 and functional unit 4 may be relatively lower, thereby minimizing energy loss and heat dissipation on the integrated circuit.

In one embodiment, the frequency dividers may be configured to generate the quarter rate clock signals at their respective outputs. As input signals, each of the frequency dividers 3 may receive one of the two clock signals with half frequency compared to the master clock signal 1 and constant phase relation of 180°. Thus, each frequency divider 3 may generate two quarter rate clock signals in response to receiving a half frequency clock signal, each of the generated quarter rate signals having half the frequency of the received half frequency clock signal. In one embodiment, the frequency dividers 3 may also increase an amplitude of a received clock signal.

Figure 3:
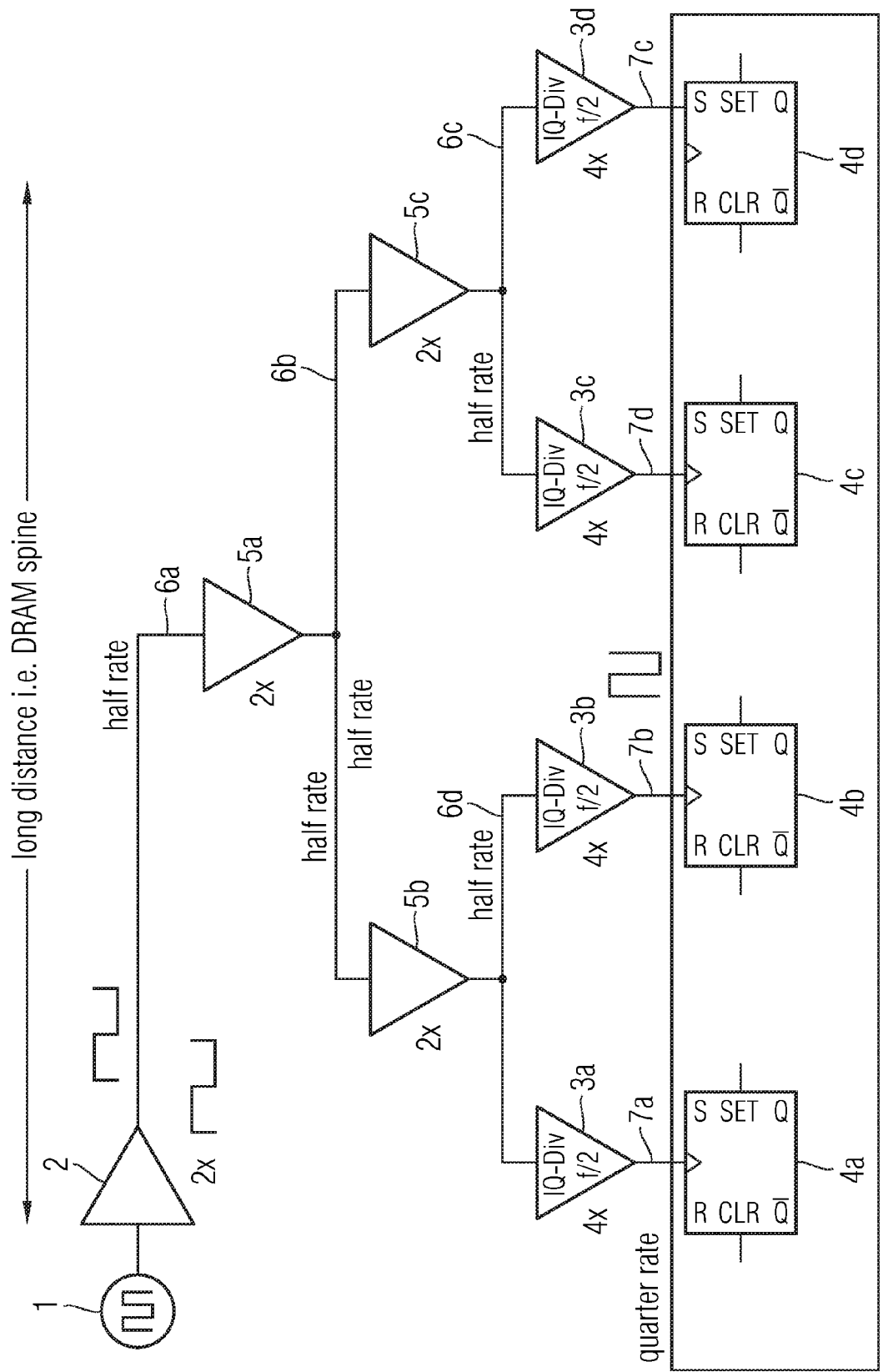
FIG. 3 illustrates an exemplary clock distribution network according to another embodiment of the invention.

FIG. 3 illustrates another embodiment of the invention. The embodiment according to FIG. 3 includes a clock generator 1. This clock generator may include a quartz oscillator and may be located in different locations as described previously with respect to the embodiment according to FIG. 2. It may also be embodied as a separate device coupled with the integrated circuit. Clock generator 1 may deliver a single clock signal or a plurality of clock signals correlated to each other by a constant phase. A constant phase as it is defined here may involve some jitter of one or both clock signals, so that slight variations of the phase occur.

The integrated circuit according to the implementation of FIG. 3 may also include an amplifier 2. As described previously with respect to the implementation according to FIG. 2, the amplifier 2 may adapt the frequency, the phase or the number of clock signals delivered from clock generator 1, in one embodiment of the invention. Amplifier 2 may also filter noise or perform an impedance matching. In some embodiments, amplifier 2 may be omitted.

The clock signal either as delivered by clock generator 1 or reshaped by amplifier 2, may be delivered by a first part 6a of a first interconnecting network to another amplifier 5. As previously described with respect to FIG. 2, the first interconnect 6 may be made from a structured metallization layer.

The output of the amplifier 5a is coupled to a respective input of amplifiers 5b and 5c by means of a second part of the first interconnect 6b. The output of each of said amplifiers 5c and 5b is coupled to a respective input of frequency dividers 3a, 3b, 3c and 3d by means of a third and fourth part of the first interconnect 6c and 6d.

The amplifiers 5 may be used to increase the amplitude of the clock signal in order to allow a compensation for signal losses due to the ohmic resistance of the wired interconnect 6. Furthermore, the amplifiers 5 may allow impedance matching. Furthermore, the amplifiers 5b and 5c can be used for filtering, noise reduction, eliminating jitter or correcting the phase relation between a plurality of input signals delivered by amplifier 2. In another embodiment, not detailed in FIG. 3, the amplifiers 5 may be omitted. While three amplifiers 5 are illustrated herein, embodiments of the invention are not limited to three amplifiers 5. Depending on the needs of the system, any number of amplifiers 5 may be included. Furthermore, the output of a single amplifier 5 may not necessarily split a clock signal into two inputs of two subsequent amplifiers 5 or frequency dividers 3. An output may be split up in any other number of input signals of subsequent amplifiers 5 or frequency dividers 3.

FIG. 3 also shows four functional units 4a, 4b, 4c and 4d. The functional units may comprise some digital electronics, such as memory cells, a micro processor, a microcontroller, an A/D-converter, a D/A-converter or the like. In one embodiment, the functional units 4a, 4b, 4c and 4d may be configured to operate on edges of the quarter rate clock signals, i.e. four clock signals correlated to each other with a constant phase and a frequency which is a factor of four lower than a frequency of the single clock signal delivered by clock generator 1, or a factor of two lower than the frequency of two clock signals delivered by amplifier 2. In one embodiment, the quarter rate clock signals may be generated by frequency dividers 3a, 3b, 3d and 3c associated with each respective functional unit. The coupling between the output of a frequency divider 3 and a respective functional unit 4a, 4b, 4c or 4d is done by means of a second wired interconnect 7. This interconnect may be fabricated as explained previously with respect to FIG. 2. In this implementation, any of frequency dividers 3, amplifiers 5, functional units 4 and/or amplifier 2 may be adapted to operate on differential clock signals.

Figure 4:
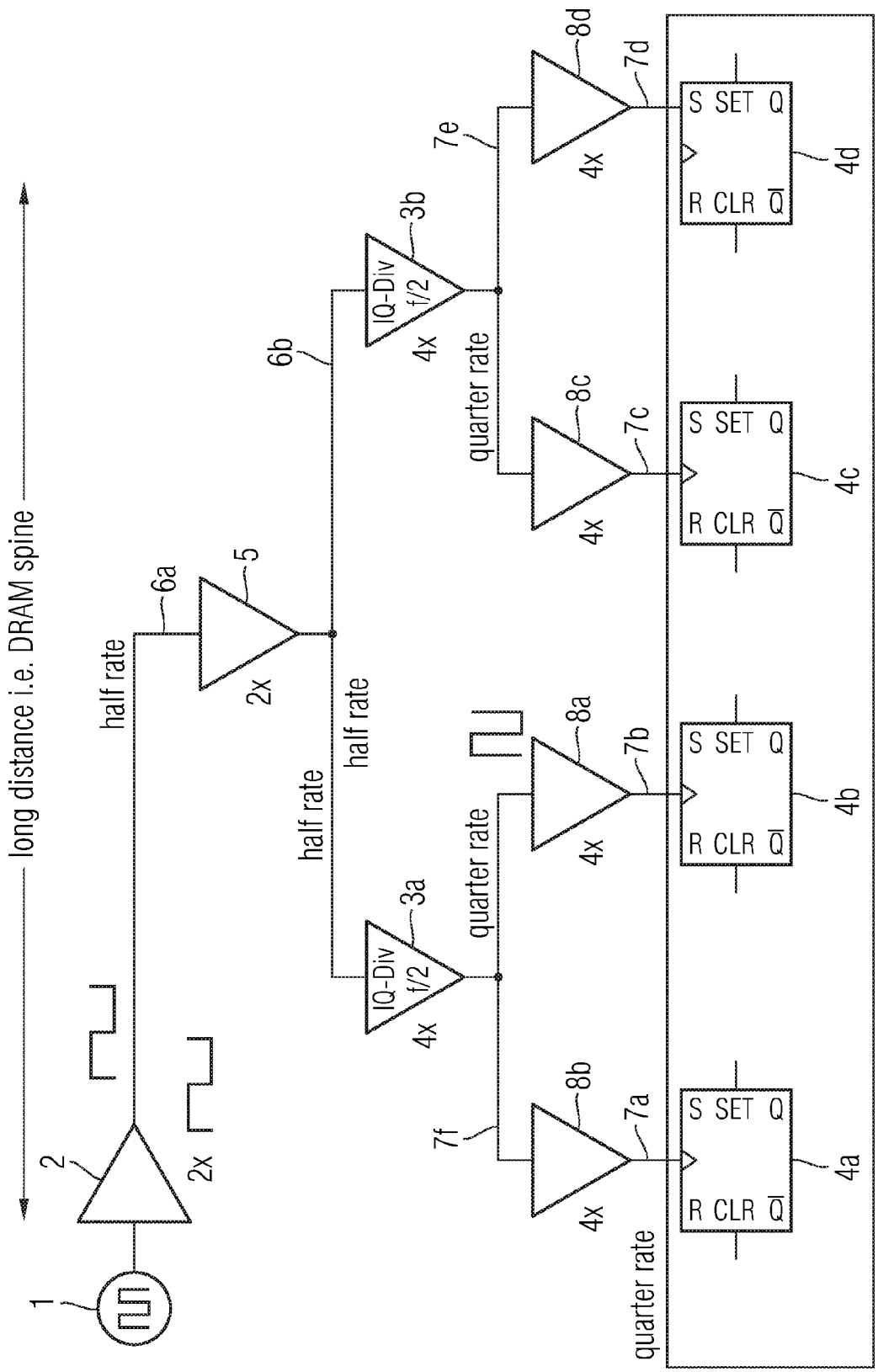
FIG. 4 illustrates an exemplary clock distribution network according to yet another embodiment of the invention.

FIG. 4 illustrates yet another embodiment of the invention, also including a clock generator 1, which is either implemented on the semiconductor die or as a separate device coupled to the integrated circuit. The implementation according to FIG. 4 may or may not comprise an amplifier 2. In one embodiment, the clock generator 1 and the amplifier 2 may be configured to provide two clock signals with a constant phase relation representing a half rate clock signal.

Half rate clock signals may be distributed by means of a first interconnect 6a to an amplifier 5. The interconnect 6a may be made from a metallization layer as previously described.

In one embodiment, the amplifier 5 may be configured to restore the amplitude of the half rate signal, the frequency or the phase relation. Furthermore, in some embodiments, the amplifier 5 may increase the signal to noise ratio or allow impedance matching.

The output signal from amplifier 5a may be split up and delivered by use of a second part 6b of the first interconnect to frequency dividers 3a and 3b. The frequency dividers 3 may be configured to receive two clock signals representing a half rate clock signal at their inputs. Each of the frequency dividers 3 may split a half rate clock signal into two quarter rate clock signals having a lower frequency and constant phase relation. The quarter rate clock signals may be delivered by a second wired interconnects 7e and 7f to amplifiers 8a, 8b, 8c and 8d.

Amplifiers 8 may be configured to restore the amplitude, the signal-to-noise ratio or the phase relation of the quarter rate clock signals. Furthermore, amplifiers 8 may provide impedance matching for all four quarter rate clock signals to the input of functional units 4. The outputs of amplifiers 8a, 8b, 8c and 8d and the inputs of functional units 4a, 4b, 4c and 4d may be coupled by further parts of said second wired interconnect 7a, 7b, 7c and 7d. In another embodiment not detailed in FIG. 4, the amplifiers 8 may be omitted. In this case, the output of frequency dividers 3 may be coupled directly to the inputs of functional units 4. It has to be noted, that the number of amplifiers 5, frequency dividers 3, amplifiers 8 and functional units 4 chosen in FIG. 4 is not limiting the scope of the invention. Any other number of said elements may be realized on the integrated circuit.

Figure 5:
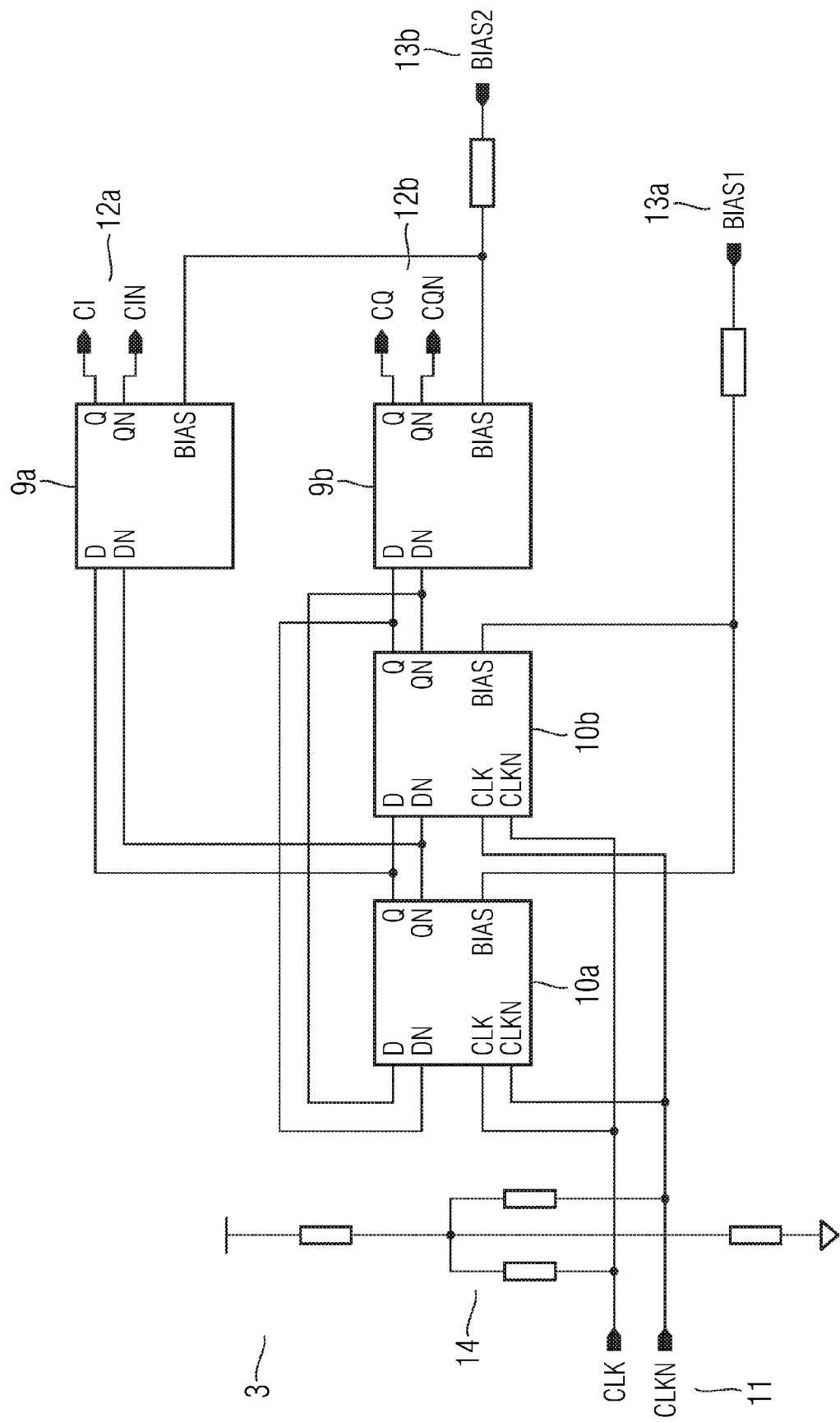
FIG. 5 illustrates a schematic diagram of an exemplary frequency divider according to an embodiment of the invention.

FIG. 5 shows a more detailed view of an exemplary frequency divider 3, according to an embodiment of the invention. The frequency divider 3 shown in FIG. 5 includes two contact pads 11 intended to couple to input signals CLK and CLKN. In this context, the input signal CLK represents a clock signal. The input signal CLKN represents the inverted signal CLK. In one embodiment, the CLK and CLKN signals may represent differential clock signals. By transmitting a differential clock signal, the signal-to-noise ratio may be increased and the reliability of the integrated circuit may be improved. However, the invention does not rely on the inverted clock signal CLKN, therefore, in some embodiments, the CLKN signal may be omitted, and the frequency divider may be configured to receive a single clock signal CLK.

The input pads 11 may be connected to a resistor network 14 comprising four resistors to a allow bias control and impedance matching of the first wired interconnect 6 delivering the input signals CLK and CLKN to the contact pads 11. The resistor network 14 may be optional and therefore, may be omitted or replaced by any other means for input signal shaping. In some embodiments, input signal shaping means may include any combination of resistors, capacitors, inductors, amplifiers, and the like.

In one embodiment, the input signals CLK and CLKN may be connected to the clock inputs of a pair of series-connected D-type flip-flops 10a and 10b. The output of the second flip-flop 10b may be inverted and coupled to the input of the first flip-flop 10a. The flip-flops 10a may be implemented as a 1-bit-storage cell. In the set up shown in FIG. 5, each of the flip-flops 10a, 10b may store a single pulse of the clock signal for one working cycle of the clock signal. Therefore, the outputs Q and QN may be broadened by one clock cycle thereby reducing the frequency of the output signal by a factor of two. Furthermore, said flip-flops 10a and 10b, add some delay to the output signals thereby generating a phase shift between two output signals.

In one embodiment, the respective output signals may be delivered to buffer elements 9a and 9b. The outputs of buffer elements 9a and 9b may be connected to a pair of contact pads 12a and 12b for sending the respective output signals CI, CIN and CQ, CQN. The buffer elements 9a and 9b allow for impedance matching of the second interconnect 7 connected to contact pads 12 and increase the electric current to avoid signal degeneration over the second interconnecting network 7. Buffer elements 9a and 9b may be optional and may be omitted or substituted by any other suitable means, such as transistor based amplifiers, inductors, capacitors or resistors, in some embodiments.

Contact pads 13a and 13b may allow application of a bias voltage. These bias pads may be used to adjust a tail current of current sources that may be a part of buffer elements 9a and 9b and flip-flops 10. The bias pads 13 may be omitted in some embodiments of frequency divider 3.

The interconnects shown in FIG. 5 may be realized as micro strip lines with matched impedance on an integrated circuit. This may avoid reflection of signals and signal losses. Nevertheless, any other interconnect may be suitable to connect contact pads 11, 12 and 13 to the core elements of the circuit, for example, the buffer elements 9a and 9b and flip-flops 10.

Figure 6:
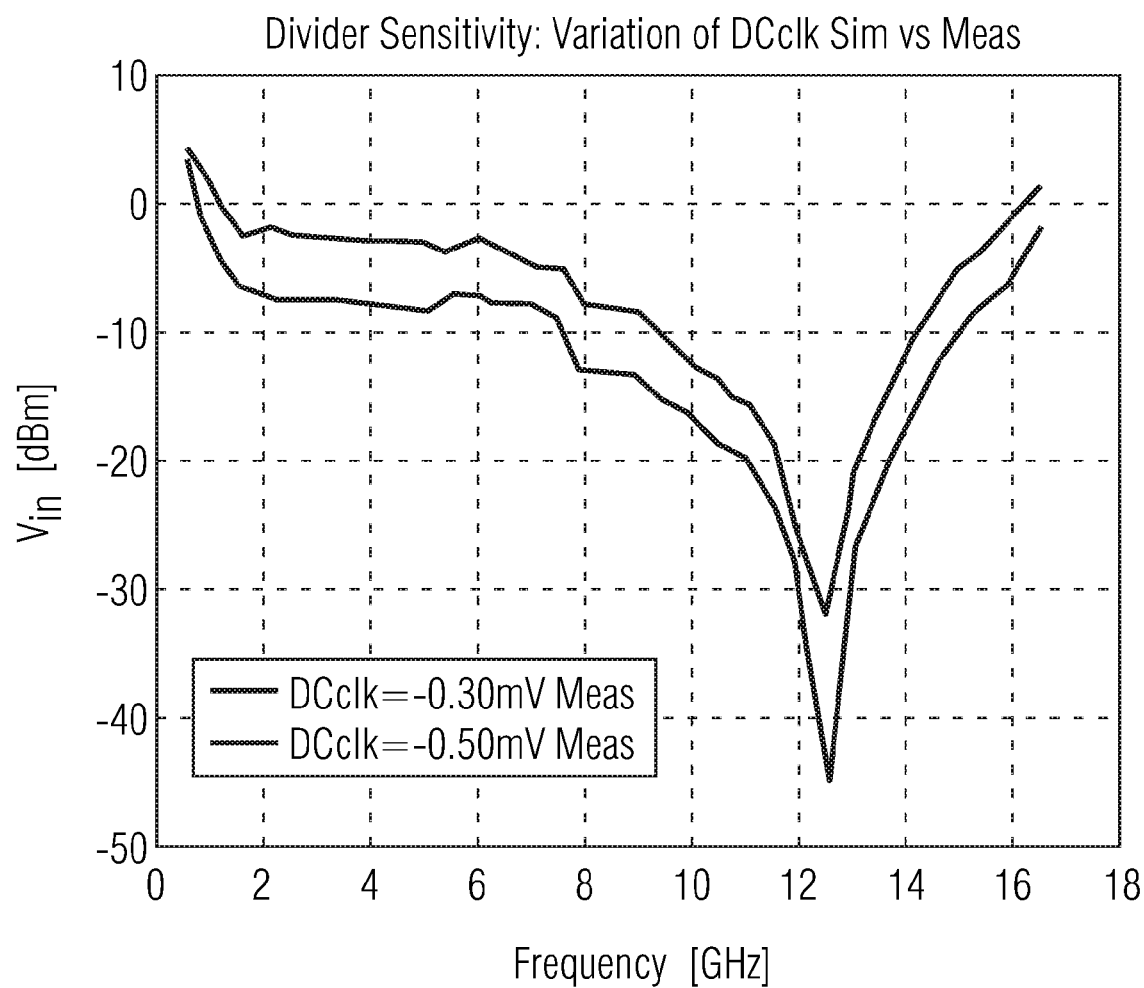
FIG. 6 illustrates exemplary measured input sensitivity of the frequency divider of FIG. 5 according to an embodiment of the invention.

FIG. 6 illustrates an exemplary measured input sensitivity of the frequency divider shown in FIG. 5 at different DC-levels of the clock signal. The DC-level of the clock signal may be determined by resistor network 14. FIG. 6 shows the frequency of the clock signal CLK and, when in use, clock signal CLKN on the horizontal axis. An attenuation of the input voltage is given on the horizontal access.

In one embodiment, the supply voltage of buffer elements 9a and 9b and flip-flops 10 may be fixed at 1.5 V. FIG. 6 shows that the frequency divider shown in FIG. 5 restores the full signal amplitude at its respective outputs 12a and 12b, even when the amplitude of the input signal is low. Therefore, a signal attenuation in the first interconnecting network 6 may be recovered by means of the frequency divider 3. Said recovery of the full amplitude may be exceptionally strong at the resonance-like inverted peak located around 12.5 GHz. A resonance is the tendency of the system to oscillate at a maximum amplitude at a certain frequency known as the resonant frequency. At this frequency, even small periodic driving forces can produce large amplitude vibrations as the system stores vibrational energy. Therefore, the resonance can be seen in the sensitivity graph of FIG. 6 as an inverted peak.

The resonance frequency of the frequency divider 3 may be adapted to the working frequency of the clock signals CLK and CLKN on the respective integrated circuit. This resonance frequency may be chosen from the range of 0.5 to 30 GHz. While operating on the resonance frequency, frequency divider 3 may even restore an exceptionally attenuated clock signal delivered by the first interconnecting network 6.

Looking at the two curves detailed in FIG. 6, a slightly lower bias of −0.5 mV may allow for a smaller input voltage amplitude compared to a higher bias of −0.3 V of the clock signals CLK and CLKN. Therefore, the bias voltage may be adjusted by means of the resistor network 14 to allow for best input sensitivity in the respective application.

While the foregoing is directed to embodiments of the invention, other and further embodiments of this invention may be devised without departing from the basic scope of the invention, the scope of the present invention being determined by the claims that follow.

What is claimed is:

1. An integrated circuit, comprising:
   at least one functional unit configured to operate at a first frequency;
   at least one frequency divider configured to receive a first clock signal at a second frequency and generate a plurality of second clock signals, each having a third frequency;
   at least one first interconnect coupling a contact pad of the integrated circuit with an input of the frequency divider, wherein the at least one first interconnect is configured to transfer the first clock signal from the contact pad to the frequency divider; and
   at least one second interconnect coupling an output of the frequency divider with an input of the functional unit, a total length of the second interconnect being less than a total length of the first interconnect, wherein the at least one second interconnect is configured to transfer the plurality of second clock signals to the at least one functional unit, wherein the functional unit operates at the first frequency triggered by at least one of the leading edge and trailing edge of the plurality of second clock signals, wherein the frequency divider operates at a resonance frequency to recover a signal attenuation in the first interconnect coupling.

2. The integrated circuit of claim 1, wherein the frequency divider is configured to receive the first clock signal having the second frequency as an input signal and generate two clock signals each having the third frequency as output signals, wherein the third frequency is lower than the second frequency and the output signals are correlated to each other with a constant phase.

3. The integrated circuit of claim 1, wherein the at least one functional unit comprises at least one dedicated frequency divider.

4. The integrated circuit of claim 1, wherein at least one of the first interconnect and the second interconnect is split to provide a plurality of outputs from a single input.

5. The integrated circuit of claim 1, wherein at least one of the first interconnect and the second interconnect comprises a circuit configured to change any one of the impedance of the interconnect, the amplitude of the signal, and the phase of the signal.

6. The integrated circuit of claim 1, wherein the functional unit, the frequency divider, the first interconnect, the second interconnect, and the contact pad are integrated on a single silicon die.

7. The integrated circuit of claim 1, wherein the functional unit comprises a plurality of memory cells.

8. A method for delivering at least one clock signal to a functional unit, comprising:
   providing at least one clock signal at a predefined rate;
   splitting the clock signal into two half rate clock signals, wherein the two half rate clock signals are correlated to each other with a constant phase;
   distributing the two half rate clock signals to an input of at least one frequency divider by means of at least one first interconnect;
   splitting the two half rate clock signals into four quarter rate clock signals, wherein the four quarter rate clock signals are correlated to each other with a constant phase by means of the at least one frequency divider; and
   distributing the four quarter rate clock signals to an input of at least one functional unit by means of at least one second interconnect, wherein an operation of the functional unit is triggered by at least one of the leading edge and trailing edge of the quarter rate clock signals, wherein a total length of the at least one second interconnect is less than a total length of the at least one first interconnect, wherein a signal attenuation in the at least one first interconnect is recovered by means of the at least one frequency divider.

9. The method of claim 8, wherein any one or more of an impedance of the interconnect, an amplitude of the signal, and a phase of the signal is changed by a circuit coupled to any one of the first interconnect and the second interconnect.

10. The method of claim 8, wherein the functional unit comprises a plurality of memory cells.

11. An integrated circuit, comprising:
    a splitting circuit configured to receive a clock signal at a rate and generate two half rate clock signals that are correlated to each other with a constant phase;
    at least one first interconnect configured to transfer the two half rate clock signals from the splitting circuit to at least one frequency divider, wherein the at least one frequency divider is configured to receive the two half rate clock signals and generate four quarter rate clock signals that are correlated to each other with a constant phase; and
    at least one second interconnect configured to transfer the four quarter rate clock signals from the at least one frequency divider to a functional unit, wherein a total length of the second interconnect is less than a total length of the first interconnect, wherein the frequency divider increases an amplitude of the two half rate clock signals.

12. The integrated circuit of claim 11, wherein the at least one first interconnect includes an amplifier configured to adjust an amplitude of the two half rate clock signals to a predetermined amplitude.

13. The integrated circuit of claim 11, wherein any one of the first interconnect and the second interconnect comprises a circuit configured to change at least one of the impedance of the interconnect, the amplitude of the signal, and the phase of the signal.

* * * * *